United States Patent
Cheng

(10) Patent No.: US 8,791,737 B2
(45) Date of Patent: Jul. 29, 2014

(54) PHASE-LOCKED LOOP AND METHOD FOR CLOCK DELAY ADJUSTMENT

(75) Inventor: Wen-Chang Cheng, Taoyuan County (TW)

(73) Assignee: Nanya Technology Corporation, Taoyuan (TW)

(*) Notice: Subject to any disclaimer, the term of this patent is extended or adjusted under 35 U.S.C. 154(b) by 26 days.

(21) Appl. No.: 13/590,185

(22) Filed: Aug. 20, 2012

(65) Prior Publication Data

US 2014/0049302 A1    Feb. 20, 2014

(51) Int. Cl.
*H03L 7/06*    (2006.01)
(52) U.S. Cl.
USPC .......................................................... 327/157
(58) Field of Classification Search
USPC .......................................................... 327/157
See application file for complete search history.

(56) References Cited

U.S. PATENT DOCUMENTS

| 6,160,456 | A | 12/2000 | Chang |
| 2002/0125933 | A1* | 9/2002 | Tamura et al. ................. 327/390 |
| 2005/0093594 | A1 | 5/2005 | Kim et al. |
| 2007/0109030 | A1* | 5/2007 | Park ............................ 327/156 |
| 2009/0085618 | A1* | 4/2009 | Schneider et al. ............. 327/143 |

* cited by examiner

*Primary Examiner* — Daniel Rojas
(74) *Attorney, Agent, or Firm* — Jiang Chyun IP Office

(57) ABSTRACT

A phase-locked loop (PLL) for clock delay adjustment and a method thereof are disclosed. The method includes the following steps. A reference clock signal and a clock signal are generated. The reference clock signal is fed through an N-divider to generate an output clock signal having a frequency 1/N of the reference clock signal. In a phase frequency detector, a control signal is generated in accordance with a phase difference and a frequency difference between the output clock signal and a feedback signal generated by a voltage controlled oscillator coupled to the phase frequency detector. The control signal is then fed through a charge pump and a loop filter to generate a voltage control signal according to the control signal. Moreover, in an adjustable delay element, a blended delay signal is generated according to a clock signal and the voltage control signal.

6 Claims, 4 Drawing Sheets

PHASE-LOCKED LOOP AND METHOD FOR CLOCK DELAY ADJUSTMENT

BACKGROUND

1. Technical Field

The invention relates to a phase-locked loop (PLL), and more particularly, to a PLL for clock delay adjustment and a method thereof.

2. Related Art

With the advancement of technology, high-speed digital input-output (I/O) systems with I/O circuits have become critical components in many electronic devices used in such applications as telecommunications and information processing. Generally speaking, when the high-speed I/O circuits of electronic devices such as the Graphics Double Data Rate, version 5 (GDDR5) Synchronous Dynamic Random Access Memory (SDRAM) need to be tested, testing equipments capable of generating data patterns having greater than 6 Gbps data rate are required.

However, such testing equipments tend to be pricey, and they are typically separate from the device under test. Moreover, the unit delay cell of the test circuits is typically dependent on process, voltage, and/or temperature (PVT). Accordingly, benefits may be realized by providing improved systems and methods of testing the high-speed I/O circuits that are PVT independent.

SUMMARY

The invention provides a phase-locked loop for clock delay adjustment, including an N-divider, a phase frequency detector, a charge pump, a loop filter, a voltage controlled oscillator, and an adjustable delay element. The N-divider receives a reference clock signal and generates an output clock signal having a frequency 1/N of the reference clock signal. The phase frequency detector generates a control signal according to a phase difference and a frequency difference between the output clock signal and a feedback signal. The charge pump receives the control signal of the phase frequency detector, and the loop filter is coupled to the charge pump for generating a voltage control signal according to the control signal of the phase frequency detector. The voltage controlled oscillator is coupled to the phase frequency detector for transmitting the feedback signal to the phase frequency detector. Moreover, the adjustable delay element generates a blended delay signal according to a clock signal and the voltage control signal.

From another perspective, the invention provides a method for clock delay adjustment including the following steps. A reference clock signal and a clock signal are generated. The reference clock signal is fed through an N-divider to generate an output clock signal having a frequency 1/N of the reference clock signal. In a phase frequency detector, a control signal is generated in accordance with a phase difference and a frequency difference between the output clock signal and a feedback signal generated by a voltage controlled oscillator coupled to the phase frequency detector. The control signal is then fed through a charge pump and a loop filter to generate a voltage control signal according to the control signal. Moreover, in an adjustable delay element, a blended delay signal is generated according to a clock signal and the voltage control signal.

In summary, some embodiments of the invention provide phase-locked loops for clock delay adjustment and the methods thereof, such that except for neglible jitter observed in the phase locked loops, the adjustable delay of the phase-locked loops and the methods described in the embodiments are only dependent on the reference clock signal. In other words, the phase-locked loops in the invention are independent of process, voltage, and/or temperature, i.e. PVT. Accordingly, since the adjustable delay is PVT independent, applications such as the testing of the high-speed I/O circuits can be achieved with the phase-locked loops and the methods described herein.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
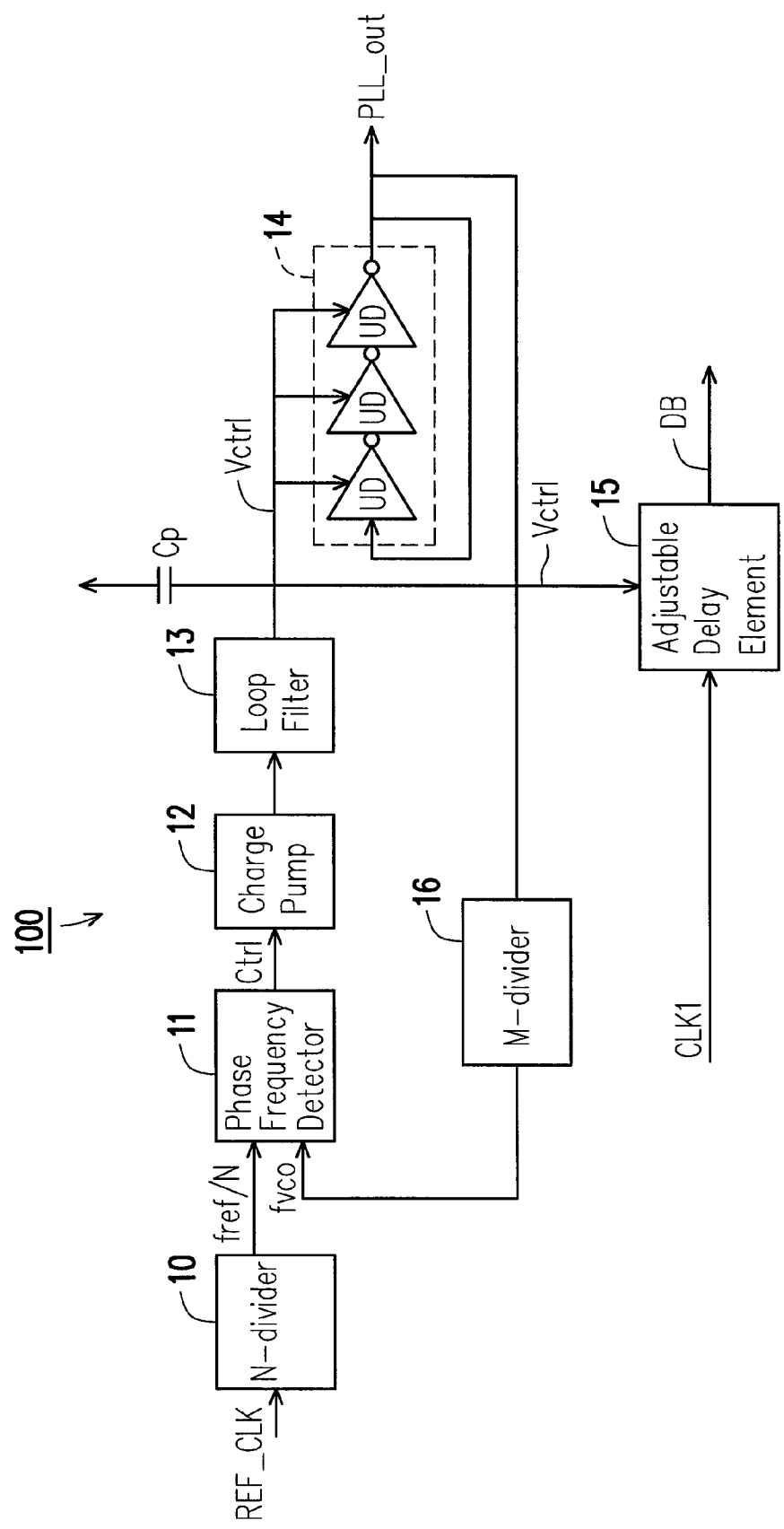
FIG. 1 is a schematic block diagram of a phase-locked loop for clock delay adjustment according to an embodiment of the invention.

FIG. 1 is a schematic block diagram of a phase-locked loop for clock delay adjustment according to an embodiment of the invention. With reference to FIG. 1, a phase-locked loop 100 for clock delay adjustment includes an N-divider 10, a phase frequency detector 11, a charge pump 12, a loop filter 13, a voltage controlled oscillator 14, an adjustable delay element 15, and a M-divider 16.

In the present embodiment, the N-divider 10 receives a reference clock signal REF_CLK and generates an output clock signal fref/N having a frequency 1/N of the reference clock signal REF_CLK. The phase frequency detector 11 generates a control signal Ctrl according to a phase difference and a frequency difference between the output clock signal fref/N and a feedback signal fvco. The charge pump 12 receives the control signal Ctrl of the phase frequency detector 11. Moreover, the loop filter 13 is coupled to the charge pump 12, and the loop filter 13 generates a voltage control signal Vctrl according to the control signal Ctrl of the phase frequency detector 11. The voltage control signal Vctrl is coupled to the adjustable delay element 15 and to a capacitor Cp connected to a ground terminal, for example.

The voltage controlled oscillator 14 is coupled to the phase frequency detector 11, and the voltage controlled oscillator 14 transmits a feedback signal fvco to the phase frequency detector 11 through the M-divider 16. However, neither the N-divider 10 nor the M-divider 16 are required elements in the phase-locked loop 100. That is, N and M may both be equal to 1, or one or both of the N-divider 10 and the M-divider 16 may be omitted in the phase-locked loop 100. The N-divider 10 and the M-divider 16 are depicted in FIG. 1 to facilitate description. The voltage controlled oscillator 14 may also transmit an output signal PLL_out to another circuit block (not drawn). In the present embodiment, the feedback signal fvco has a frequency 1/M of the frequency of the output signal PLL_out from the voltage controlled oscillator 14. In some embodiments of the invention, the voltage controlled oscillator 14 may include at least one unit delay cell UD connected in series. The unit delay cells in the voltage controlled oscillator 14 may be inverters, for example, although the invention is not limited thereto. According to the application, people skilled in the art may adjust the unit delay cells in the voltage controlled oscillator 14 to be RC delay units (not shown) consisting of a resistor and a capacitor, for instance. Moreover, the unit delay cells UD are shown as inverters in the drawings to facilitate description, but should not be construed as limiting the scope of the invention.

The adjustable delay element 15 generates a blended delay signal DB to latch data queue (DQ) loop back data according to a clock signal CLK1 and the voltage control signal Vctrl. In one embodiment of the invention, the input signals REF_CLK and CLK1 may have frequencies adaptable for using the phase-locked loop 100 in a memory circuit (not drawn). For example, the clock signal CLK1 may be operated at 3.2 GHz in a Graphics Double Data Rate, version 5 (GDDR5) Synchronous Dynamic Random Access Memory (SDRAM) circuit.

Figure 2:
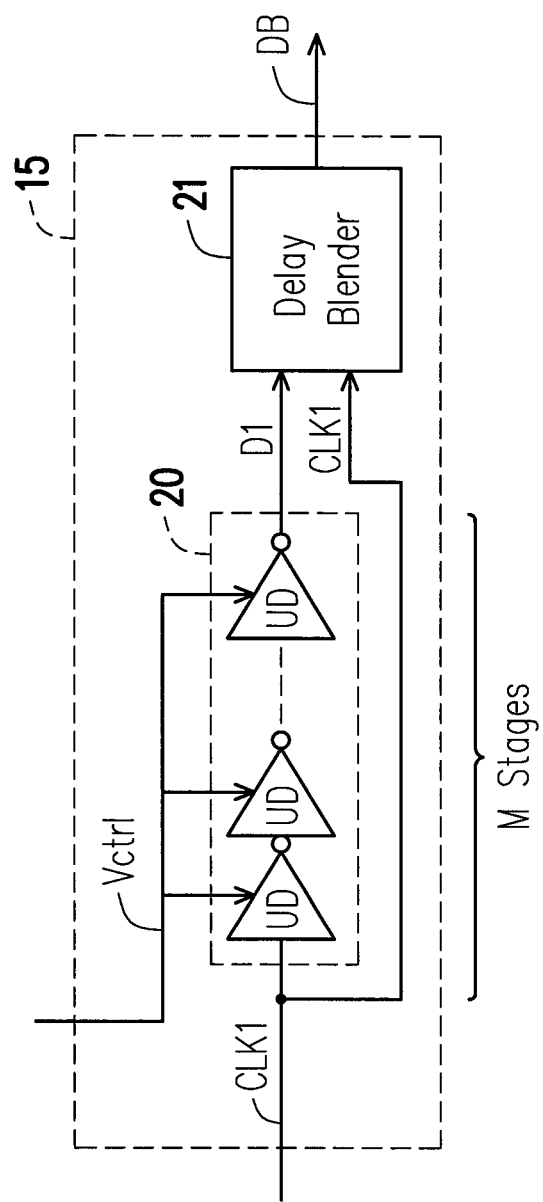
FIG. 2 is a schematic view of an adjustable delay element according to an embodiment of the invention.

FIG. 2 is a schematic view of an adjustable delay element according to an embodiment of the invention. The similar components in the embodiments illustrated by the figures are denoted by the same numerals in the following description. Referring to FIGS. 1 and 2, the adjustable delay element 15 includes a delay array 20 and a delay blender 21. In the present embodiment, the delay array 20 receives the clock signal CLK1 and generates a delay signal D1 according to the clock signal CLK1 and the voltage control signal Vctrl. The delay blender 21 receives the delay signal D1 from the delay array 20 and generates a blended delay signal DB according to the clock signal CLK1 and a delay signal D1.

In one embodiment of the invention, the delay array 20 may include at least one of the unit delay cells UD in the voltage controlled oscillator 14 connected in series. For example, as shown in FIG. 2, the delay array 20 has M stages of unit delay cells UD in the voltage controlled oscillator 14 connected in series, and a maximum adjustable delay of the phase-locked loop 100 for clock delay adjustment is denoted by $M \times T_{UD}$, where $T_{UD}$ represents a delay period of each of the unit delay cells UD. As shown in FIGS. 1 and 2, since the unit delay cells UD of the voltage controlled oscillator 14 are used in the delay array 20 of the adjustable delay element 15, the maximum adjustable delay is proportional to the period of the reference clock signal REF_CLK. That is, except for neglible jitter observed in the phase locked loop 100, the phase-locked loop 100 for clock delay adjustment is only dependent on the reference clock signal REF_CLK, and the phase-locked loop 100 is therefore independent of process, voltage, and/or temperature (PVT).

Figure 3A:
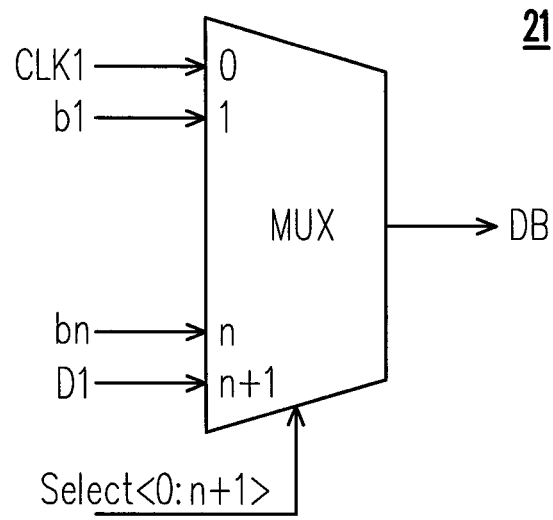
FIG. 3A is a schematic view of a delay blender in an adjustable delay element according to an embodiment of the invention.
Figure 3B:
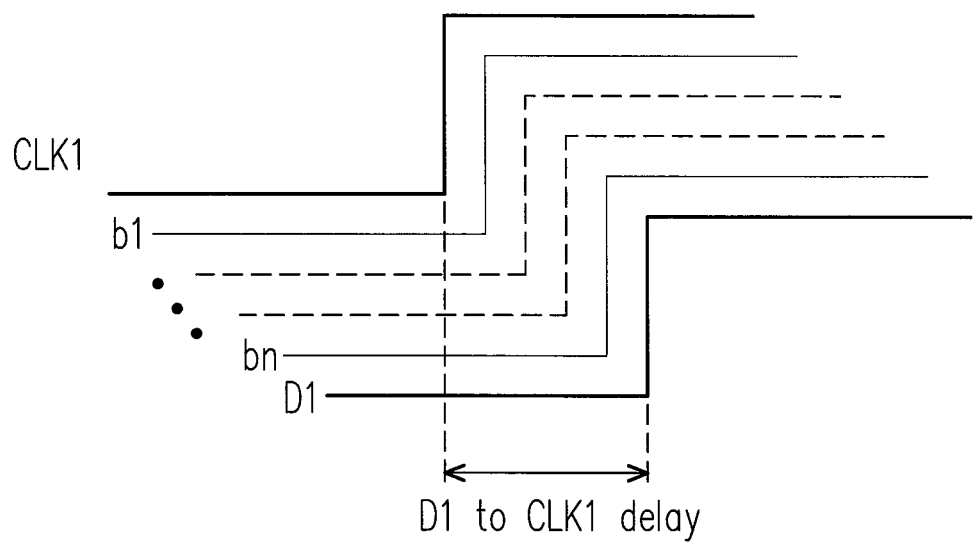
FIG. 3B is a timing diagram of the delay blender depicted in FIG. 3A according to an embodiment of the invention.

In some embodiments of the invention, the blended delay signal DB generated by the delay blender 21 has a phase difference between the clock signal CLK1 and the delay signal D1. In one embodiment, the phase difference of the blended delay signal DB generated by the delay blender 21 between the clock signal CLK1 and the delay signal D1 is selectable between an even number of substantially equal steps. The number of selectable steps in the delay blender 21 may be 16, for example, although the invention is not limited thereto. FIG. 3A is a schematic view of a delay blender in an adjustable delay element according to an embodiment of the invention. Referring to FIG. 3A, the phase selection of the blended delay signal DB may be implemented by a switching mechanism, such as with a multiplexer shown in FIG. 3A, although the phase selection may be implemented in the delay blender 21 by other schemes known to people skilled in the art. In one example of a select signal Select<0:n+1> shown in FIG. 3A, if the select signal Select<0>=1, and Select<1:n+1>=0, then the clock signal CLK1 is connected to the blended delay signal DB. Other input signals b1 . . . bn and D1 may also be connected to the blended delay signal DB according to the select signal Select<0:n+1>. FIG. 3B is a timing diagram of the delay blender depicted in FIG. 3A according to an embodiment of the invention. In FIG. 3B, a selectable delay interval of the phase difference between the clock signal CLK1 and the delay signal D1 is shown by the vertical dotted lines.

Figure 4:
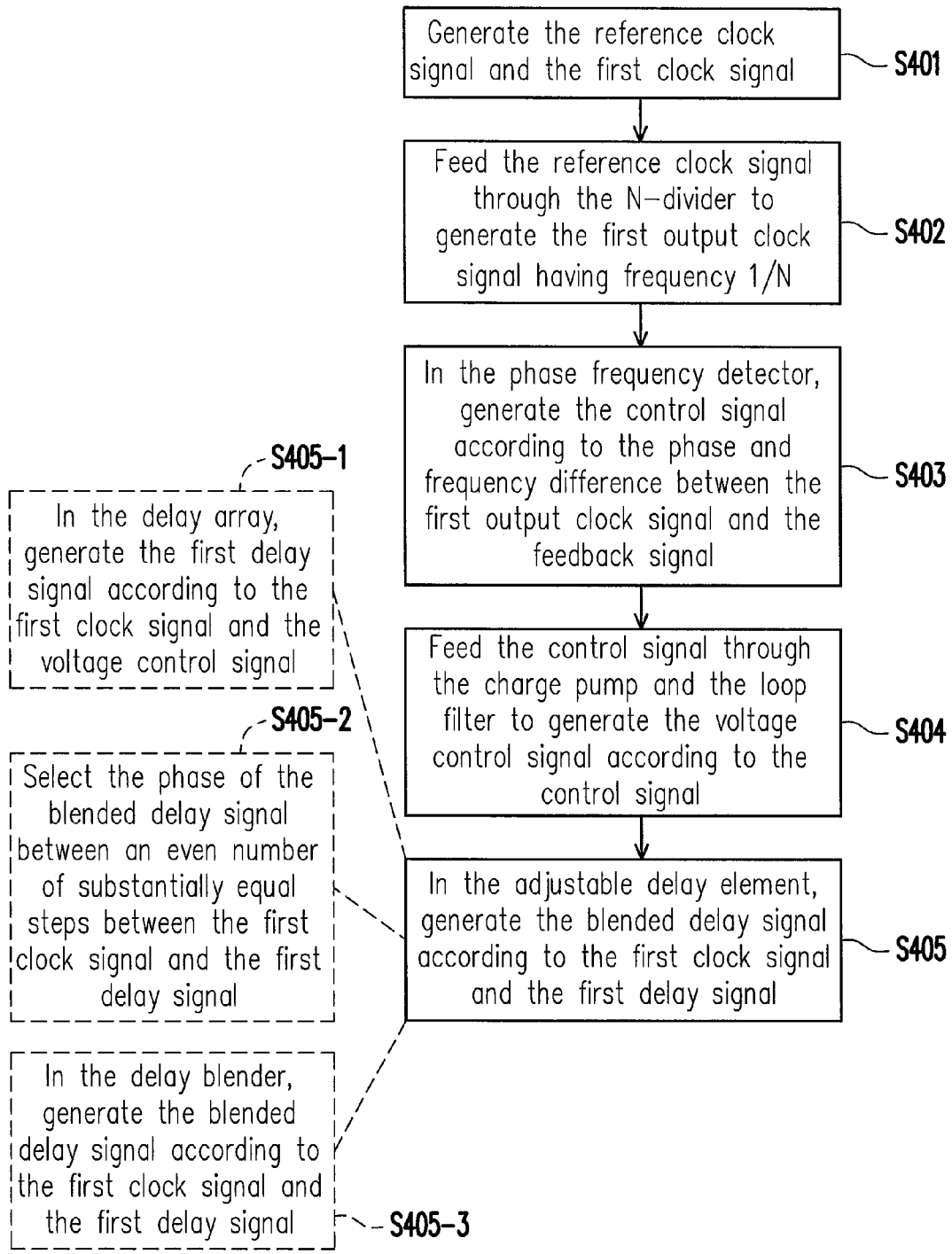
FIG. 4 is a flow diagram of a method for clock delay adjustment according to an embodiment of the invention.

From another perspective, a method for clock delay adjustment can be achieved with reference to the foregoing description. FIG. 4 is a flow diagram of a method for clock delay adjustment according to an embodiment of the invention. Referring to FIG. 4, in Step S401, a reference clock signal and a clock signal are generated. The reference clock signal is fed through an N-divider to generate an output clock signal having a frequency 1/N of the reference clock signal (Step S402). In a phase frequency detector, a control signal is generated in accordance with a phase difference and a frequency difference between the output clock signal and a feedback signal generated by a voltage controlled oscillator coupled to the phase frequency detector (Step S403). The control signal is then fed through a charge pump and a loop filter to generate a voltage control signal according to the control signal (Step S404). Moreover, in an adjustable delay element, a blended delay signal is generated according to a clock signal and the voltage control signal (Step S405).

In one embodiment of the invention, the step of generating the blended delay signal according to the clock signal and the delay signal in the adjustable delay element further includes generating a delay signal according to the clock signal and the voltage control signal in a delay array (Step S405-1), and in a delay blender, generating the blended delay signal according to the clock signal and a delay signal (Step S405-3).

In another embodiment of the invention, the step of generating the blended delay signal according to the clock signal and the delay signal further includes selecting the phase of the blended delay signal between an even number of substantially equal steps between the clock signal and the delay signal (Step S405-2). Although the phase selection in Step S405-2 can be performed between Steps S405-1 and S405-3 as shown in FIG. 4, the method for clock delay adjustment in the invention is not limited thereto. The phase of the blended delay signal may be predetermined or selected before the generation of the blended delay signal in Step S405, for example. Since the detailed description of other aspects of the method for clock delay adjustment has been described earlier when discussing the phase-locked loop 100, further elaboration thereof is omitted hereafter.

In view of the foregoing, some embodiments of the invention provide phase-locked loops for clock delay adjustment and the methods thereof, such that except for neglible jitter observed in the phase locked loops, the adjustable delay of the phase-locked loops and the methods described in the embodiments are only dependent on the reference clock signal. In other words, the phase-locked loops in the invention are independent of process, voltage, and/or temperature. Accordingly, since the adjustable delay is PVT independent, applications such as the testing of the high-speed I/O circuits can be achieved with the phase-locked loops and the methods described herein.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A phase-locked loop with an adjustable delay element for clock delay adjustment, comprising:
   an N-divider receiving a reference clock signal and generating an output clock signal having a frequency 1/N of the reference clock signal;
   a phase frequency detector generating a control signal according to a phase difference and a frequency difference between the output clock signal and a feedback signal;
   a charge pump receiving the control signal of the phase frequency detector;
   a loop filter coupled to the charge pump for generating a voltage control signal according to the control signal of the phase frequency detector;
   a voltage controlled oscillator coupled to the phase frequency detector and transmitting the feedback signal to the phase frequency detector; and
   an adjustable delay element generating a blended delay signal according to a clock signal and the voltage control signal, wherein the adjustable delay element comprises:
      a delay array receiving the clock signal and generating a delay signal according to the clock signal and the voltage control signal; and
      a delay blender receiving the delay signal from the delay array and generating a blended delay signal according to the clock signal and the delay signal,
      wherein the blended delay signal generated by the delay blender has a phase difference between the clock signal and the delay signal, and the phase difference is selected among a plurality of steps according to the delay signal generated by the delay array.

2. The phase-locked loop of claim 1, wherein the voltage controlled oscillator comprises at least one unit delay cell connected in series.

3. The phase-locked loop of claim 2, wherein the delay array comprises at least one unit delay cell same with the at least one unit delay cell in the voltage controlled oscillator connected in series.

4. A method for clock delay adjustment, comprising:
   generating a reference clock signal and a clock signal;
   feeding the reference clock signal through an N-divider to generate an output clock signal having a frequency 1/N of the reference clock signal;
   in a phase frequency detector, generating a control signal according to a phase difference and a frequency difference between the output clock signal and a feedback signal generated by a voltage controlled oscillator coupled to the phase frequency detector;
   feeding the control signal through a charge pump and a loop filter to generate a voltage control signal according to the control signal;
   in an adjustable delay element, generating a blended delay signal according to a clock signal and the voltage control signal, wherein the step of generating the blended delay signal according to the clock signal and the delay signal in the adjustable delay element comprises:
      in a delay array, generating a delay signal according to the clock signal and the voltage control signal; and
      in a delay blender, generating the blended delay signal according to the clock signal and a delay signal,
      wherein the blended delay signal generated by the delay blender has a phase difference between the clock signal and the delay signal, and the phase difference is selected among a plurality of steps according to the delay signal generated by the delay may.

5. The method of claim 4, wherein the voltage controlled oscillator comprises at least one unit delay cell connected in series.

6. The method of claim 5, wherein the delay array comprises at least one unit delay cell same with the at least one unit delay cell in the voltage controlled oscillator connected in series.

* * * * *